(12) United States Patent
Stamper et al.

(10) Patent No.: US 11,183,514 B2
(45) Date of Patent: Nov. 23, 2021

(54) VERTICALLY STACKED FIELD EFFECT TRANSISTORS

(71) Applicant: GLOBALFOUNDRIES U.S. INC., Santa Clara, CA (US)

(72) Inventors: Anthony K. Stamper, Burlington, VT (US); Steven M. Shank, Jericho, VT (US); Siva P. Adusumilli, Burlington, VT (US); Michel J. Abou-Khalil, Essex Junction, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 71 days.

(21) Appl. No.: 16/561,956

(22) Filed: Sep. 5, 2019

(65) Prior Publication Data
US 2021/0074730 A1    Mar. 11, 2021

(51) Int. Cl.
| | |
|---|---|
| *H01L 27/092* | (2006.01) |
| *H01L 27/12* | (2006.01) |
| *H01L 27/02* | (2006.01) |
| *H01L 29/16* | (2006.01) |
| *H01L 29/08* | (2006.01) |
| *H01L 29/417* | (2006.01) |
| *H01L 29/10* | (2006.01) |
| *H01L 29/40* | (2006.01) |
| *H01L 21/762* | (2006.01) |
| *H01L 21/311* | (2006.01) |
| *H01L 21/02* | (2006.01) |
| *H01L 21/84* | (2006.01) |
| *H01L 21/3065* | (2006.01) |
| *H01L 29/66* | (2006.01) |

(52) U.S. Cl.
CPC .... *H01L 27/1203* (2013.01); *H01L 21/02532* (2013.01); *H01L 21/3065* (2013.01); *H01L 21/31111* (2013.01); *H01L 21/7624* (2013.01); *H01L 21/84* (2013.01); *H01L 27/0207* (2013.01); *H01L 29/0847* (2013.01); *H01L 29/1087* (2013.01); *H01L 29/16* (2013.01); *H01L 29/401* (2013.01); *H01L 29/41758* (2013.01); *H01L 29/665* (2013.01)

(58) Field of Classification Search
None
See application file for complete search history.

(56) References Cited

U.S. PATENT DOCUMENTS

| | | | |
|---|---|---|---|
| 4,522,662 | A | 6/1985 | Bradbury et al. |
| 4,948,456 | A | 8/1990 | Schubert |
| 6,137,128 | A | 10/2000 | Holmes et al. |
| 7,446,374 | B2 | 11/2008 | Thorup et al. |
| 8,941,178 | B2 | 1/2015 | Yamamoto et al. |

(Continued)

*Primary Examiner* — Ali Naraghi
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to vertically stacked field effect transistors and methods of manufacture. The structure includes: at least one lower gate structure on a bottom of a trench formed in substrate material; insulator material partially filling trench and over the at least one lower gate structure; an epitaxial material on the insulator material and isolated from sidewalls of the trench; and at least one upper gate structure stacked vertically above the at least one lower gate structure and located on the epitaxial material.

10 Claims, 10 Drawing Sheets

(56) References Cited

U.S. PATENT DOCUMENTS

| | | |
|---|---|---|
| 10,192,779 B1 | 1/2019 | Shank et al. |
| 2007/0018166 A1* | 1/2007 | Atanackovic ... H01L 21/823807 257/64 |
| 2010/0006928 A1 | 1/2010 | Pan et al. |
| 2010/0090668 A1 | 4/2010 | Girdhar et al. |
| 2010/0140693 A1 | 6/2010 | Hébert |
| 2011/0233617 A1* | 9/2011 | Or-Bach ........... H01L 21/76254 257/202 |
| 2011/0260233 A1 | 10/2011 | Nguyen et al. |
| 2018/0350785 A1* | 12/2018 | Fong ....................... H01L 24/83 |
| 2021/0057413 A1* | 2/2021 | Dewey ............ H01L 21/823814 |

\* cited by examiner

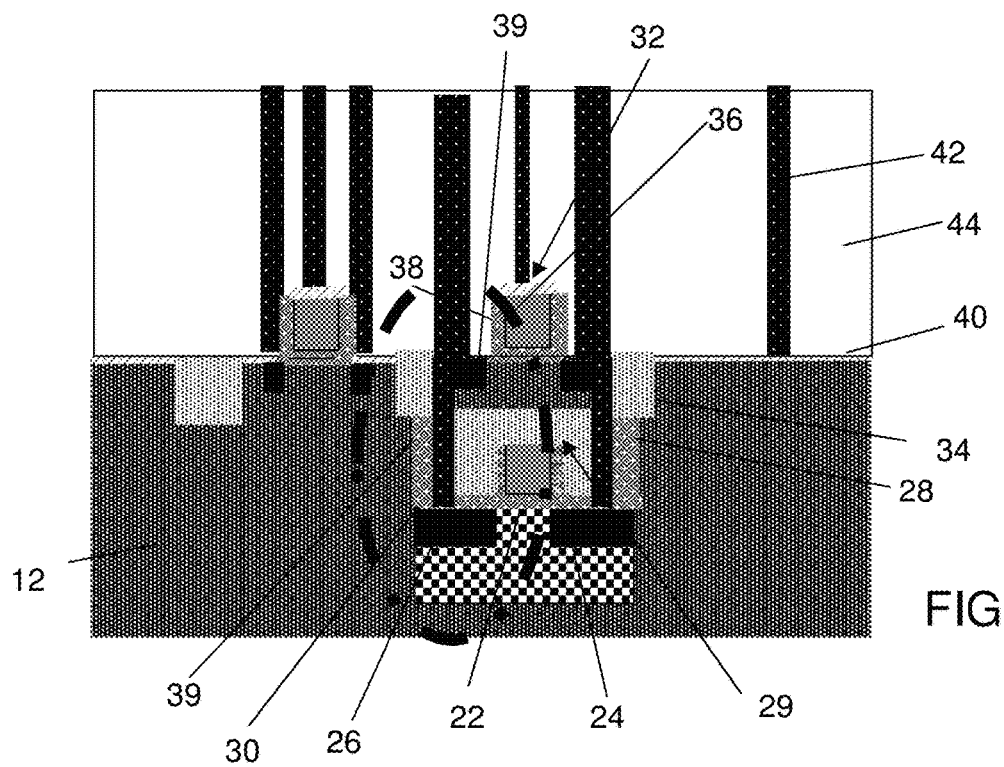
FIG. 14A
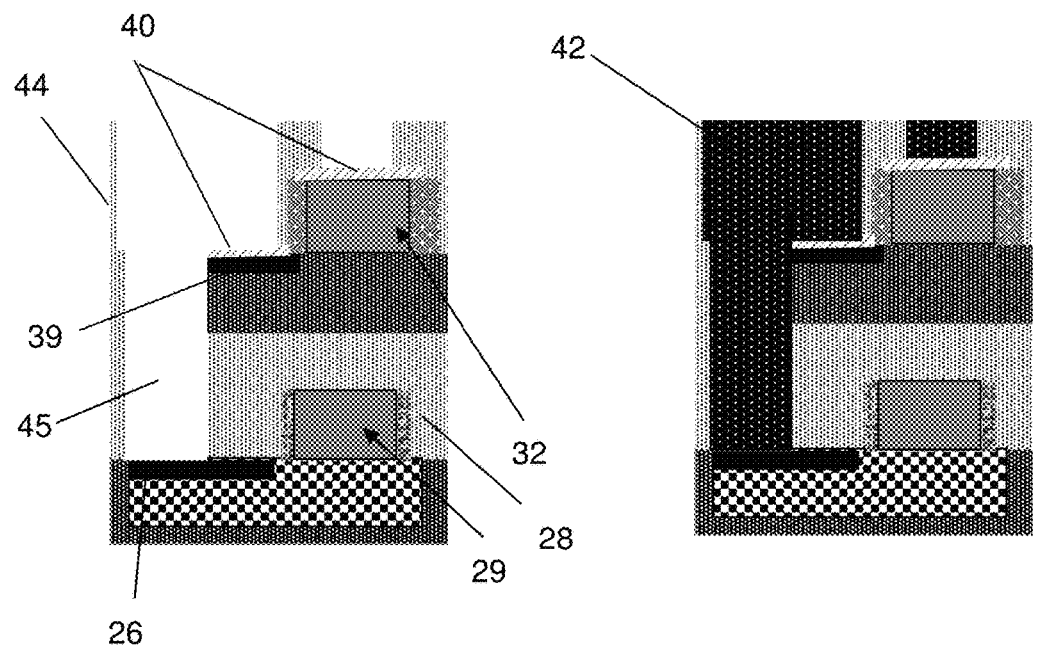
FIG. 14B
FIG. 14C

VERTICALLY STACKED FIELD EFFECT TRANSISTORS

FIELD OF THE INVENTION

The present disclosure relates to semiconductor structures and, more particularly, to vertically stacked field effect transistors and methods of manufacture.

BACKGROUND

A basic switching device opens and closes an electrical circuit. Conventional switches can be fabricated using conventional CMOS technologies. In conventional CMOS technologies, the switch is fabricated as a field effect transistor (FET). In these technologies, the switch is fabricated using a single level poly layout on a silicon on insulator (SOI) wafer. These switches are expensive to manufacture and also use a large amount of valuable real estate on the chip.

SUMMARY

In an aspect of the disclosure, a structure comprises: at least one lower gate structure on a bottom of a trench formed in substrate material; insulator material partially filling trench and over the at least one lower gate structure; an epitaxial material on the insulator material and isolated from sidewalls of the trench; and at least one upper gate structure stacked vertically above the at least one lower gate structure and located on the epitaxial material.

In an aspect of the disclosure, a structure comprises: a single crystalline substrate material; a trench formed in the single crystalline substrate material; a first gate structure on a bottom of the trench, with source and drain regions formed in the single crystalline substrate material in the bottom of the trench; an epitaxial material of single crystalline material which is isolated from the single crystalline substrate material and the first gate structure; and a second gate structure on the epitaxial material of single crystalline material, with source and drain regions formed in the epitaxial material of single crystalline material.

In an aspect of the disclosure, a method comprises: forming a trench formed in substrate material; forming a lower gate structure at a bottom of the trench, with source and drain regions formed in the substrate material in the bottom of the trench; filling the trench over the lower gate structure with insulator material; recessing the insulator material to expose sidewalls of the trench; growing an epitaxial material from the exposed sidewalls of the trench and over the recessed insulator material and the lower gate structure; isolating the epitaxial material from the substrate material; and forming an upper gate structure on the epitaxial material vertically over the lower gate structure, with source and drain regions formed in the epitaxial material.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGS. 14A-14C shows contacts, amongst other features, and respective fabrication processes in accordance with aspects of the present disclosure.

DETAILED DESCRIPTION

The present disclosure relates to semiconductor structures and, more particularly, to vertically stacked field effect transistors (FETs) and methods of manufacture. More specifically, the present disclosure describes vertically stacked FETs and vertically stacked FETs with a body voltage bias or body/channel depletion, as examples. Advantageously, the present disclosure provides significant savings in both chip area usage and manufacturing costs for vertically stacked FETs.

Recent developments have focused on replacing the expensive semiconductor on insulator (SOI) wafer with an inexpensive bulk silicon wafer combined with forming a high resistance region under the switch to emulate the buried oxide of the SOI technology. In at least one aspect, the present disclosure utilizes bulk technology to form a stacked FET pair to nearly halve the size of a switch-intensive integrated circuit. This is accomplished, for example, by forming lateral epi silicon over a FET formed in a trench.

By way of example, a first FET is formed in a trench, the trench is partially filled with dielectric, and an epitaxial silicon layer formed on the dielectric over the first FET. A second FET is formed on the epitaxial silicon layer over the first FET. The stacked FETs are isolated from one another by an insulating material. The stacking of the FETs will increase switch density. In embodiments, the FETs can be radio frequency (RF) switch FETs that are two FETs stacked upon each other, with the bottom FET having a dimension larger (e.g., length) than the upper FET, for example.

The vertical stack of FETs of the present disclosure can be manufactured in a number of ways using a number of different tools. In general, though, the methodologies and tools are used to form structures with dimensions in the micrometer and nanometer scale. The methodologies, i.e., technologies, employed to manufacture the vertical stack of FETs of the present disclosure have been adopted from integrated circuit (IC) technology. For example, the structures are built on wafers and are realized in films of material patterned by photolithographic processes on the top of a wafer. In particular, the fabrication of the vertical stack of FETs uses three basic building blocks: (i) deposition of thin films of material on a substrate, (ii) applying a patterned mask on top of the films by photolithographic imaging, and (iii) etching the films selectively to the mask.

Figure 1:
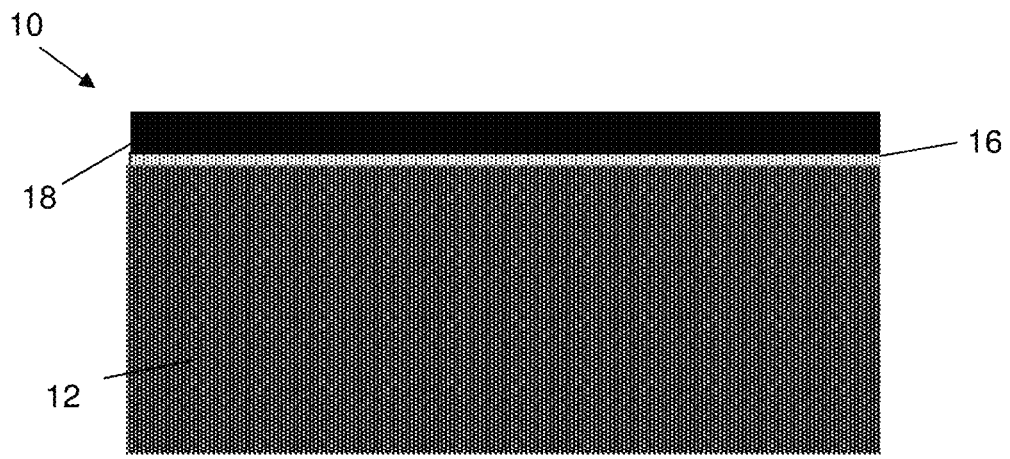
FIG. 1 shows a cross-sectional view of a wafer, amongst other features, and respective fabrication processes in accordance with aspects of the present disclosure.

FIG. 1 shows a cross-sectional view of a wafer, amongst other features, and respective fabrication processes in accordance with aspects of the present disclosure. More specifically, the structure 10 of FIG. 1 includes a substrate material 12 composed of any suitable material including, but not limited to, Si, SiGe, SiGeC, SiC, GaAs, InAs, InP, and other III/V or II/VI compound semiconductors. In more specific embodiments, the substrate material 12 is a crystalline substrate, e.g., crystalline Si. The upper surface of the substrate material 12 can be optionally lined with one or more of pad dielectric films 16, 18, used prior to masking the wafer to form a trench and to block well implants. In embodiments, the pad films 16, 18 can be a thermal silicon oxide film 16 followed by a CVD silicon nitride material 18. The oxide film 16 can be deposited to a thickness of about 10 nm; whereas, the nitride film 18 can be deposited to a thickness of about 200 nm.

Figure 2:
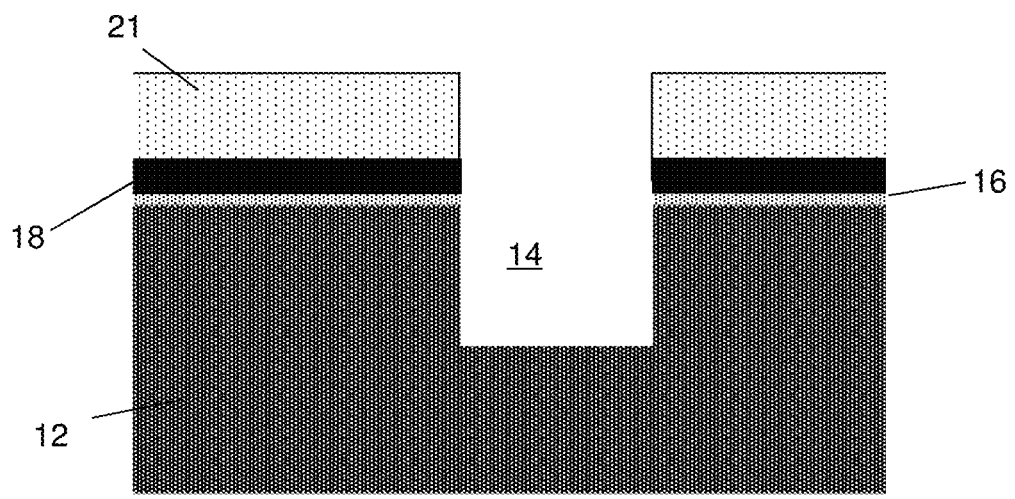
FIG. 2 shows a trench in a substrate, amongst other features, and respective fabrication processes in accordance with aspects of the present disclosure.

In FIG. 2, a trench 14 is formed in the substrate 12 by conventional lithography and etching methods known to those of skill in the art. For example, a resist layer 21 formed over the pad films 16, 18 is exposed to energy (light) to form a pattern (opening). An etching process with a selective chemistry, e.g., reactive ion etching (RIE), will be used to etch pad films 16, 18, followed by an etching of the substrate material (e.g., silicon) 12, to form one or more trenches 14 in the substrate material 12 through the openings of the resist. The trench 14 can be about 600 nm wide and 10 microns long, in one illustrative non-limiting example.

Figure 3:
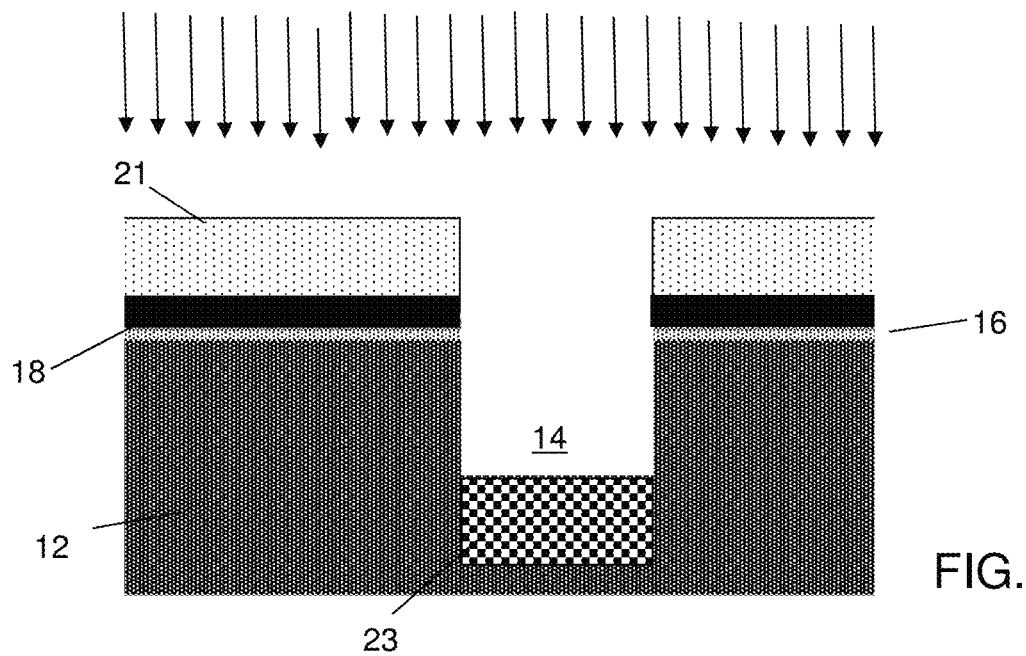
FIG. 3 shows well implants in the trench, amongst other features, and respective fabrication processes in accordance with aspects of the present disclosure.

In FIG. 3, prior to resist removal, well implants 23 are provided in the substrate material 12 in the trench 14 to form the FET wells or bodies. In embodiments, the well implants 23 can be formed by conventional ion implantation processes such that no further explanation is required herein for an understanding of the present disclosure. In FIG. 3, the resist 21 can be removed by a conventional oxygen ashing process or other known stripants.

In alternative embodiments, the resist 21 could be removed prior to the well implants 23, with the pad films 16, 18 being used to block dopant from being implanted into the substrate material 12 outside of the trench regions 14. Alternatively, the pad films 16, 18 could be stripped prior to the well implant 23 and the entire wafer surface could be implanted with well implants 23. Areas outside of the trench 14 can either be masked by the pad films 16, 18, by photoresist, or, instead, also receive the well implants 23. In specific embodiments, though, the well implants 23 are only formed in the bottom of the trench 14.

Figure 4:
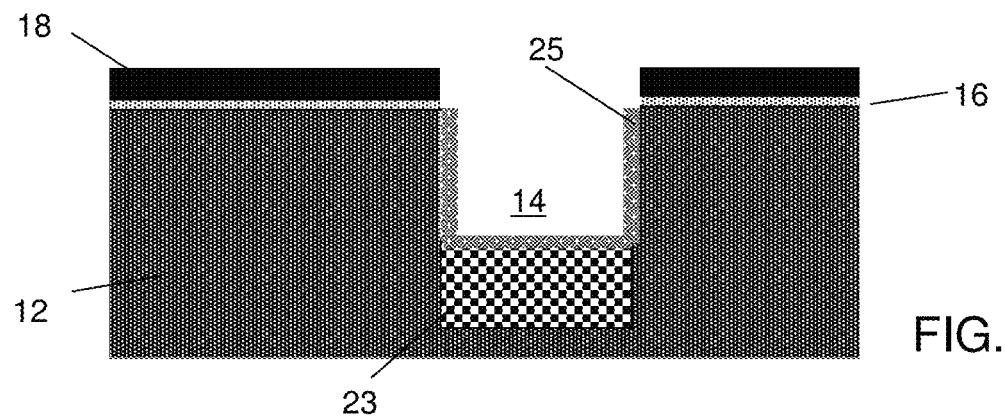
FIG. 4 shows substrate material lined with an gate dielectric material, amongst other features, and respective fabrication processes in accordance with aspects of the present disclosure.

In FIG. 4, following well implantation processes and photoresist removal, if a resist was used, a gate dielectric pre-clean is performed, as known in the art. Following the cleaning process, a gate dielectric material 25 is formed. If the gate dielectric material is formed by deposition, i.e. CVD, ALD, etc., then the trench 14 and upper surface of the substrate material 12 (over the film 16) is lined with an insulator material 25. The insulator material 25 can be a gate dielectric material deposited to a thickness of about 5 nm; although other dimensions are also contemplated herein. In embodiments, the gate dielectric material 25 can be a low-k material, e.g., oxide, or a high-k gate dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. In embodiments, the gate dielectric 25 is a $SiO_2$ layer formed in a thermal oxidization furnace or chamber. If the gate dielectric 25 is formed by a thermal oxidization of the silicon, then it will be formed on all exposed silicon surfaces, e.g. trench 14 surfaces shown in FIG. 4.

Figure 5:
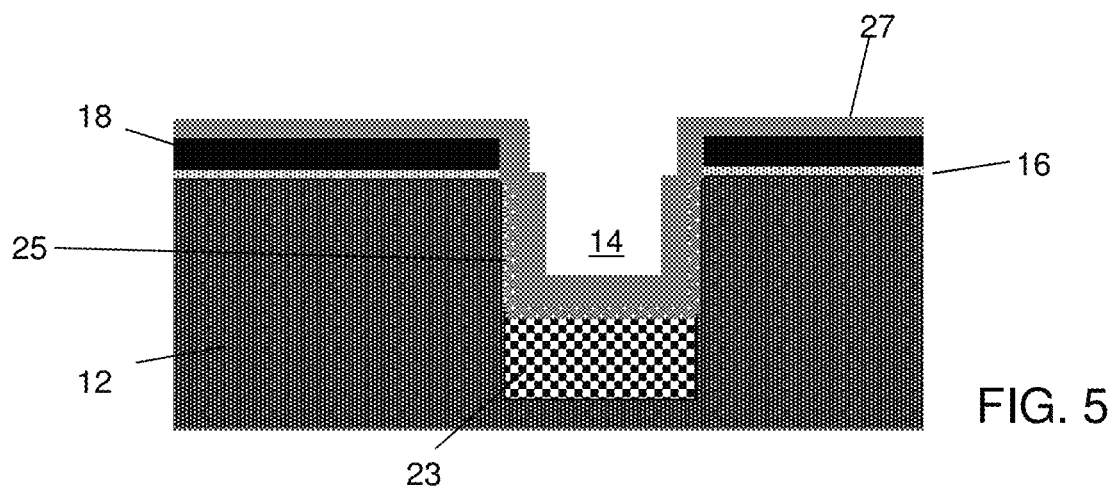
FIG. 5 shows a gate material in the trench 14 over the gate dielectric material, amongst other features, and respective fabrication processes in accordance with aspects of the present disclosure.
Figure 6:
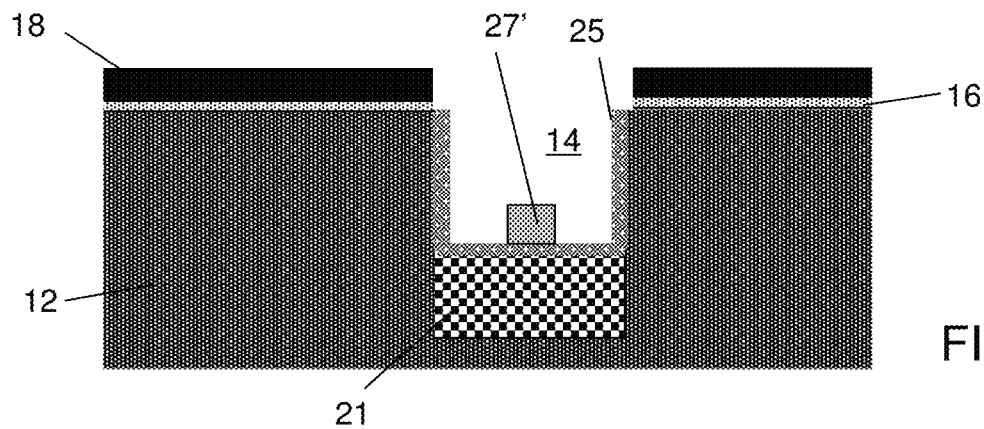
FIG. 6 shows a patterned gate material in the trench over the gate dielectric material, amongst other features, and respective fabrication processes in accordance with aspects of the present disclosure.

In FIG. 5, a gate material 27 is formed in the trench 14 over the gate dielectric material 25. In embodiments, the gate material 27, e.g., polysilicon material, is first deposited by a conventional deposition method, e.g., chemical vapor deposition (CVD), etc., and then, as shown in FIG. 6, patterned with photoresist within the trench 14 to form a patterned gate material 27'. In embodiments, the gate poly material can be etched using a conventional etching process with chemistries that are selective to the gate dielectric 25 material. For example, a combination of anisotropic and isotropic etches might be used to form the patterned gate material 27' in the bottom of the trench 14 to avoid leaving gate material on the sidewalls of the trench 14. Alternatively, the patterned gate material 27' could be left on the sidewalls of trench 14. In embodiments, a polycide gate could be used to form layer 27 by depositing polysilicon followed by a deposited conductor such as tungsten silicide. Tungsten silicide can be deposited by ALD, CVD, PVD, etc.

Figure 7:
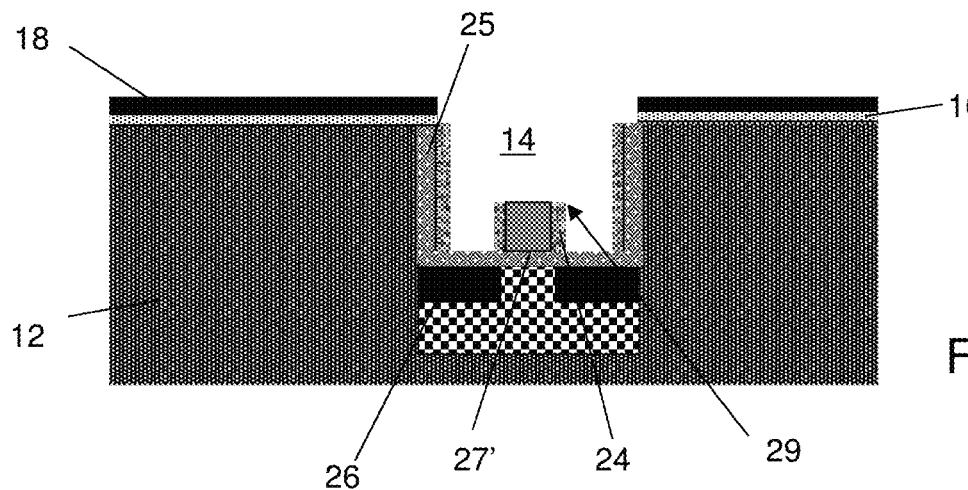
FIG. 7 shows sidewall spacers on the patterned gate material, amongst other features, and respective fabrication processes in accordance with aspects of the present disclosure.

In FIG. 7, sidewall spacers 24 are formed on the patterned gate material 27' to form the gate structure (FET) 29 (e.g., composed of materials 24, 27). In embodiments, the sidewall spacers 24 can be an oxide material or nitride material formed by a conventional deposition method, e.g., CVD, followed by an anisotropic etching process. In this way, the sidewall spacers 24 will remain on the patterned gate material 27' and on sidewalls of the trench 14, e.g., over the gate dielectric material 25. The anisotropic etching process can also thin the nitride film 18. Source and drain regions 26 are formed in the substrate 12, on sides of the gate structure 23. In embodiments, the source and drain regions 26 can be formed by conventional ion implantation processes focused on the bottom of the trench 14, as understood by those of skill in the art such that no further explanation is required for a complete understanding of the present invention.

Figure 8:
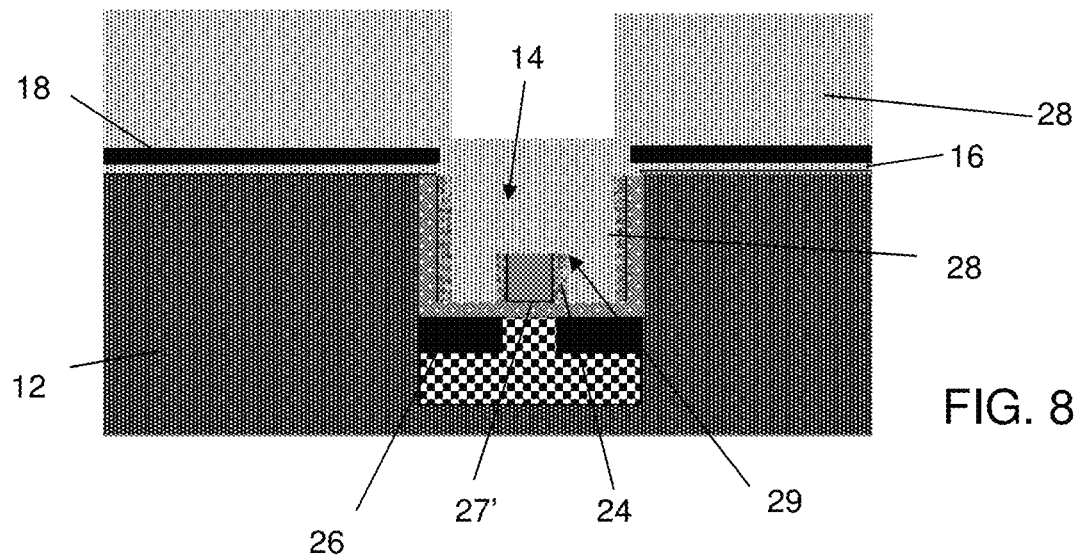
FIG. 8 shows an insulator material deposited in the trench over a gate structure, amongst other features, and respective fabrication processes in accordance with aspects of the present disclosure.

As shown further in FIG. 8, an oxide or other insulator material 28 is deposited in the trench 14 over the lower gate structure 29, in addition to a top surface of the substrate 12 (e.g., pad film 18). In embodiments, the insulator material 28 will insulate or separate the lower gate structure 29 from a subsequently formed upper gate structure. The insulator material 28 will also cover the sidewalls of the trench 14, which material is later removed by an HF etch back to expose the substrate material 12 within the trench 14.

In one example, the insulator material on the sidewalls of the trench 14 would initially be about 10% of the total width of the trench 14, prior to the etch back process which exposes the sidewalls of the trench 14. In embodiments, the etch back process results in about 0.4 micron thick layer of the insulator material 28 within the trench 14 covering the lower gate structure 29, with the remaining trench 14 having exposed sidewalls composed of the substrate material 12. In embodiments, the insulator material 28 can be an oxide material deposited by a High Density Plasma Chemical Vapor Deposition (HDPCVD) process. Alternatively, the deposition process can be a CVD process or plasma enhanced CVD (PECVD) process. In further alternative embodiments, the oxide material can be any dielectric material. In embodiments, after oxide 28 deposition, a reverse photolithographic mask and etch could be used prior to planarization, as known in the art.

Figure 9:
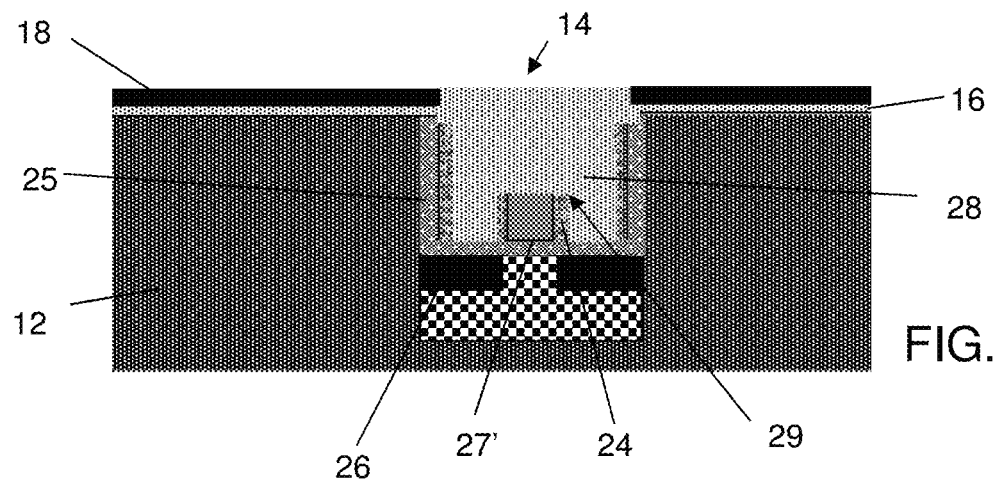
FIG. 9 shows polished insulator material, amongst other features, and respective fabrication processes in accordance with aspects of the present disclosure.
Figure 10:
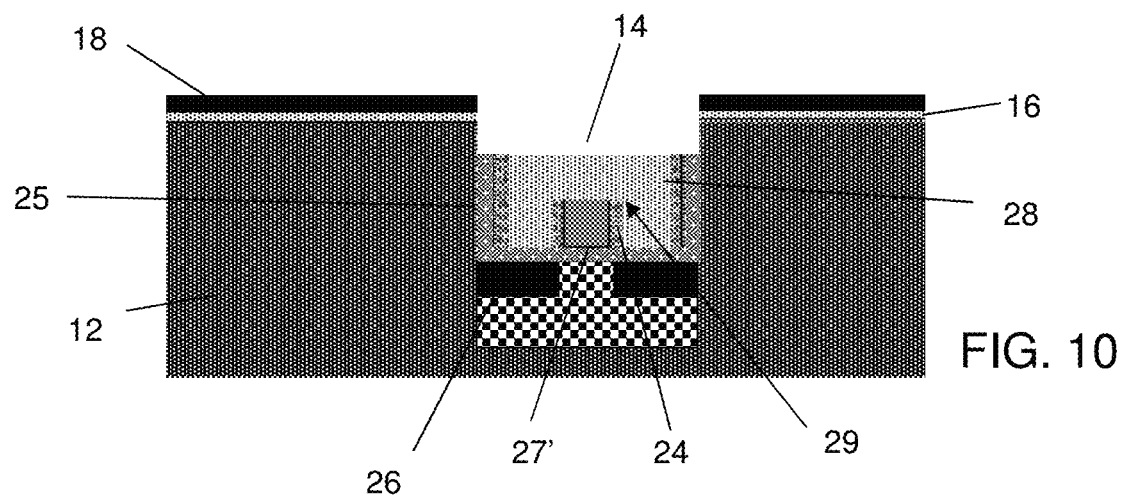
FIG. 10 shows the insulator material recessed within the trench, amongst other features, and respective fabrication processes in accordance with aspects of the present disclosure.

In FIG. 9, the insulator material 28 is polished and, in FIG. 10, the insulator material 28 is recessed within the trench 14. The polishing can be performed by a conventional chemical mechanical polishing (CMP) process; whereas, the recessing can be performed by a selective etching process.

Figure 11:
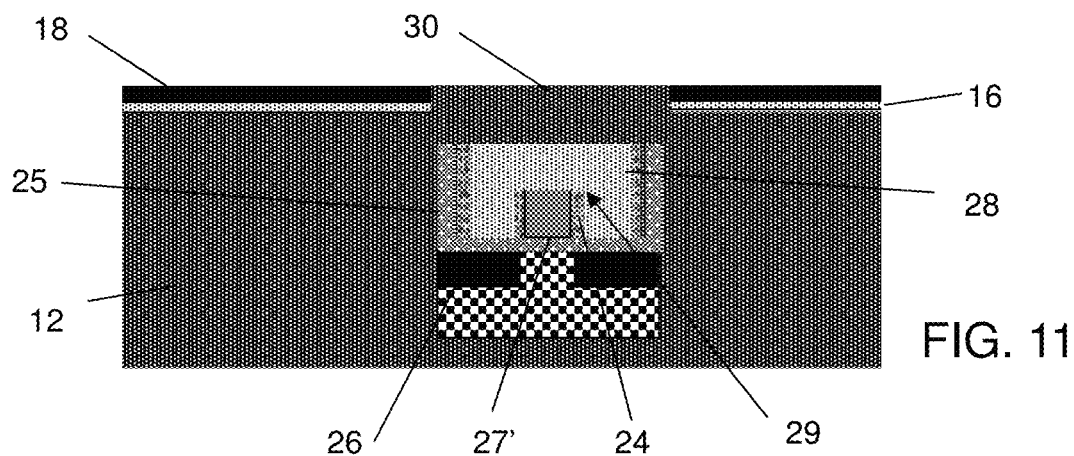
FIG. 11 shows an epitaxial material grown in the trench, amongst other features, and respective fabrication processes in accordance with aspects of the present disclosure.

In FIG. 11, a lateral epitaxial material 30 is grown in the trench 14 starting from the exposed sidewalls thereof. In embodiments, the epitaxial material 30 is crystalline silicon, which is separated from the lower gate structure 29 (e.g., lower gate structure or FET) by the insulator material 28. Prior to the growth of the epitaxial material 30, the exposed sidewalls of the trench 14 will be cleaned. In embodiments, the cleaning can be an in-situ dry cleaning process, a wet cleaning process using HF, or other known cleaning processes for removing native oxide (and other contaminants) from the exposed surface of the substrate 12 within the trench 14. During the growth process, the pad films 16, 18 deposited on the top surface of the substrate 12 will prevent the epitaxial material from spreading to other regions of the structure.

Figure 12:
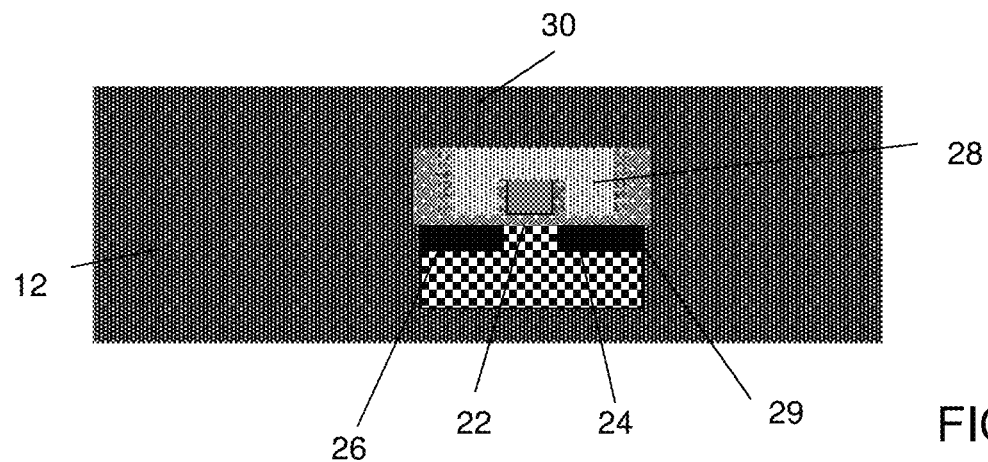
FIG. 12 shows removal of excess epitaxial material, amongst other features, and respective fabrication processes in accordance with aspects of the present disclosure.

As shown in FIG. 12, following the growth process, any excess epitaxial material can be removed on the top surface of the substrate 12. The removal process will also remove the pad materials (e.g., films 16, 18) deposited on the top surface of the substrate 12. The removal of the insulator material, pad materials (e.g., films) and excess epitaxial material can be performed by a planarization process, e.g., chemical mechanical polishing (CMP) or other etch back process. In embodiments, the pad films consist of silicon oxide 16 and silicon nitride 18, the silicon nitride 18 is removed in a phosphoric acid wet etch, the silicon nitride 16 is removed in a HF acid wet etch, and the lateral silicon region 30 is planarized using CMP as known in the art. In embodiments, the lateral silicon region 30 can be left unplanarized.

Figure 13:
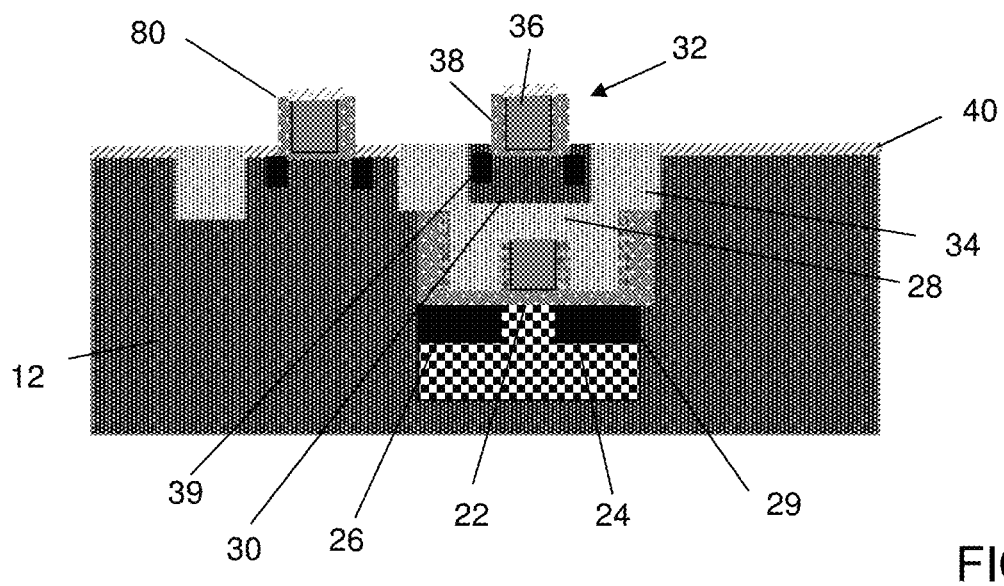
FIG. 13 shows an upper gate structure formed on the epitaxial material over the lower gate structure, amongst other features, and respective fabrication processes in accordance with aspects of the present disclosure.

FIG. 13 shows an upper gate structure (e.g., FET) 32 formed on the epitaxial material 30, over the lower gate structure 29. Prior to forming the upper gate structure 32, shallow trench isolation regions 34 are formed through the epitaxial material 30 and extend to the insulator material 28 within the trench 14. The shallow isolation regions 34 can also be formed at other locations, e.g., to the side of the trench 14. In embodiments, the shallow trench isolation regions 34 are formed by lithography, etching and deposition processes known to those of skill in the art such that no further explanation is required for a complete understanding of the present disclosure. Following the lithography, etching and deposition process, any excess insulator material (e.g., oxide) used for the shallow trench isolation regions 34 can be removed by a conventional CMP process.

Following the formation of the shallow trench isolation regions 34, a gate dielectric material and gate material (e.g., poly material) 36 are deposited and patterned on the surface of the structure, e.g., on the epitaxial material 30 and substrate 12, to form respective upper gate structures 32. Preferably, the upper gate structure 32 on the epitaxial material 30 is aligned or nearly aligned with the lower gate structure 23. Sidewall spacers 38 are formed on the patterned gate material 36 to form the upper gate structure 32 (e.g., composed of materials 36, 38). In embodiments, the sidewall spacers 38 can be an oxide material or nitride material formed by a conventional deposition method, e.g., CVD, followed by an anisotropic etching process. Source and drain regions 39 can be formed in epitaxial material 30, on sides of the gate structure 32.

In optional embodiments, the source/drain regions 39 and the upper gate structure 32 can include self-aligned silicide (known as salicide) 40. As should be understood by those of skill in the art, the silicide process begins with deposition of a thin transition metal layer, e.g., nickel, cobalt or titanium, over semiconductor material (e.g., doped or ion implanted source and drain regions 39 and active device 32). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 40 in the active regions of the device. It should be understood by those of skill in the art that silicide contacts will not be required on the devices, when a gate structure is composed of a metal material. With the same process steps used to form FET 32 above the FET in the bottom of trench 14, other devices such as but not limited to FET 80 could be formed.

FIG. 14A shows contacts 42 formed to the upper gate structures 32, lower gate structure 29 and respective source and drain regions of these gate structures 29, 32. FIGS. 14B and 14C show enlarged cross-sectional views within the dashed area of FIG. 14A and respective fabrication processes for forming the contacts 42. More specifically, the contacts 42 are formed in dielectric material 44 by using conventional lithography, etching and deposition processes.

For example, as shown in FIGS. 14A, 14B, and 14C following the deposition of the dielectric material 44, vias 45 are formed in the dielectric material 44 to expose the source/drain regions of the upper gate structure 32 in the epitaxial material 30 (and substrate 12), in addition to the source/drain regions 26 of the lower gate structure 29 through the insulator material 28. The vias 45 can also formed to the expose the gate structures 29, 32, themselves. Contact material 42, e.g., one or more of tungsten, cobalt, titanium, nickel, platinum, copper, tantalum, etc. is then deposited within the vias 45, followed by a damascene planarization process to remove excess material outside of the contact trenches. In embodiments, the contacts 42 are self-aligned to contact both the upper FET 32 and lower source/drain regions of the FET in the bottom of trench 14

FIGS. 15A-19 show alternate structures in accordance with aspects of the present disclosure, each with the upper FET structure 32 and the lower gate structure 29 formed on the bottom of trench 14, amongst other features. The alternate structures can be fabricated using the processes as already described herein, e.g., lithography, etching, deposition and planarization processes.

Figure 15A:
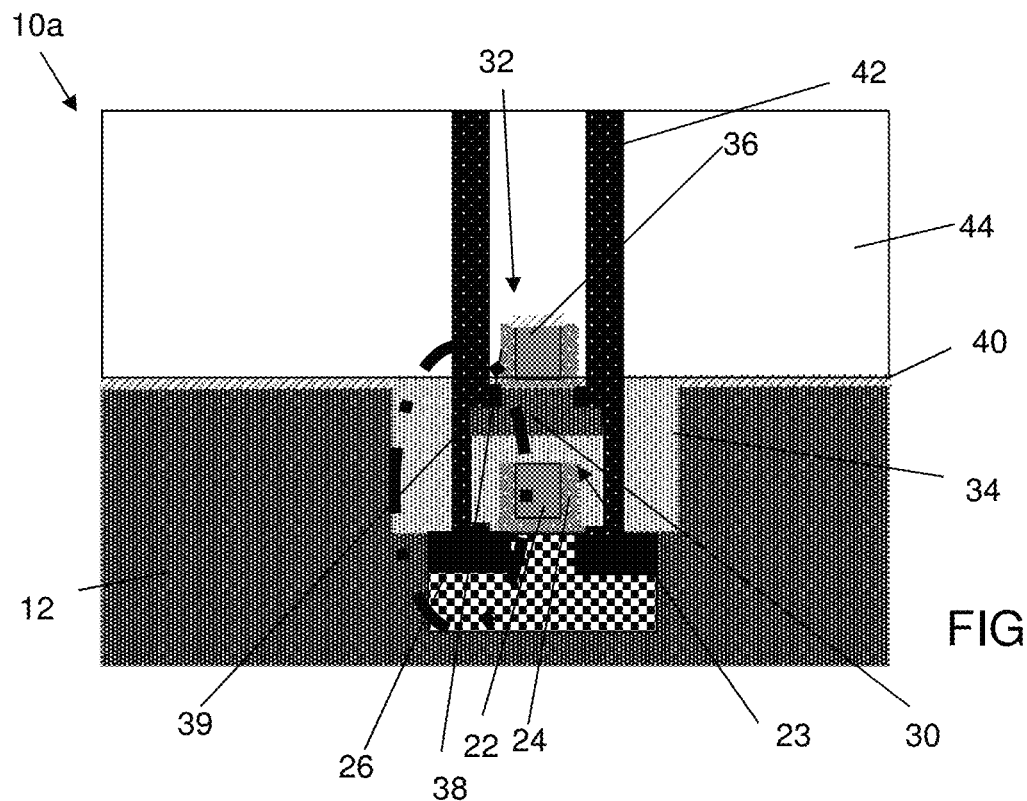
FIG. 15A-15C show an upper gate structure and a lower gate structure, amongst other features, and respective fabrication processes in accordance with additional aspects of the present disclosure.
Figures 15B, 15C:
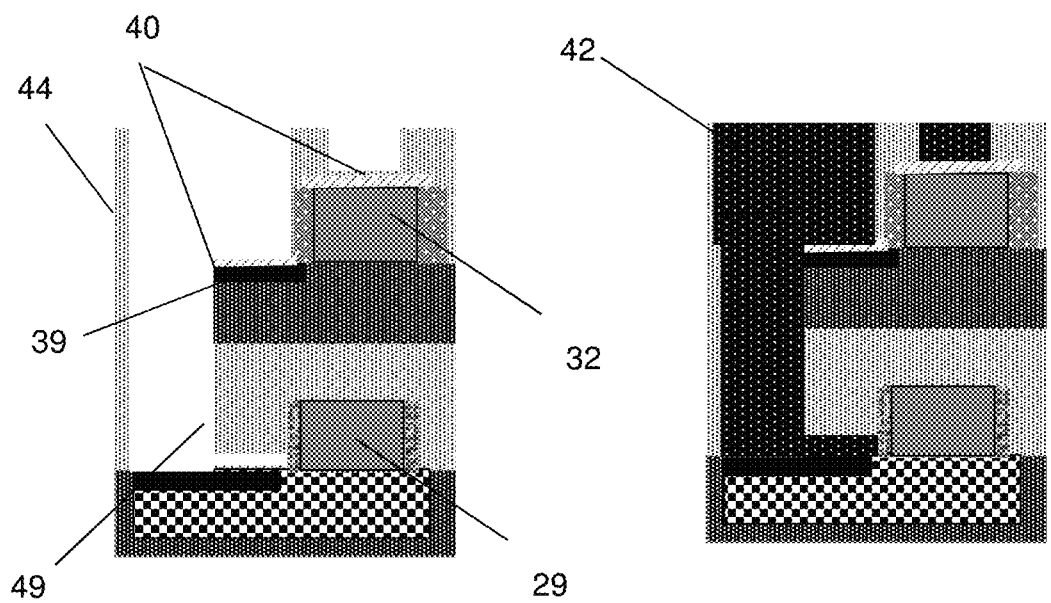

More specifically, FIG. 15A-15C show a structure 10a with the upper FET structure 32 and the lower gate structure 29 formed on the bottom of trench 14, with a larger contact area 49 extending under dielectric layer 28 for the contacts 42 for the lower gate structure 29. FIGS. 15B and 15C show an enlarged cross sectional view within the dashed area of FIG. 15A and respective fabrication processes for forming the larger contact area 49 of the contacts 42. More particularly, the landing area 49 is a lateral undercut which is filled with metal contact fill, e.g., contact 42. In this embodiment, a sacrificial material initially lines a bottom of the trench 14, preferably over dielectric material used to form the lower gate structure 29. The sacrificial material can be, e.g., PVD silicon, tungsten, or other sacrificial materials as known in the art, which is removed after the contact etch (e.g., formation of the vias described with respect to FIG. 14A-14C), using for example, XeF$_2$. In alternative embodiments, the sacrificial material can be SiN removed by hot phosphorous acid. By using the sacrificial material, it is now possible to obtain a lateral undercut landing area 49 for the contact fill. The contact fill 42 can be a metal formed deposited by a lateral atomic layer deposition (ALD) or similar conductor as part of the contact fill process, such as ALD cobalt. In this way, the contacts 42 are in direct contact with more of the source/drain regions 26 of the lower gate structure 29. In embodiments, a silicide or salacide is not formed on the source/drain of lower gate structure 29 and this lateral undercut with a ALD cobalt layer on the source/drain surface results in lower contact resistance and eliminates the need for a salacide process.

Figure 16A:
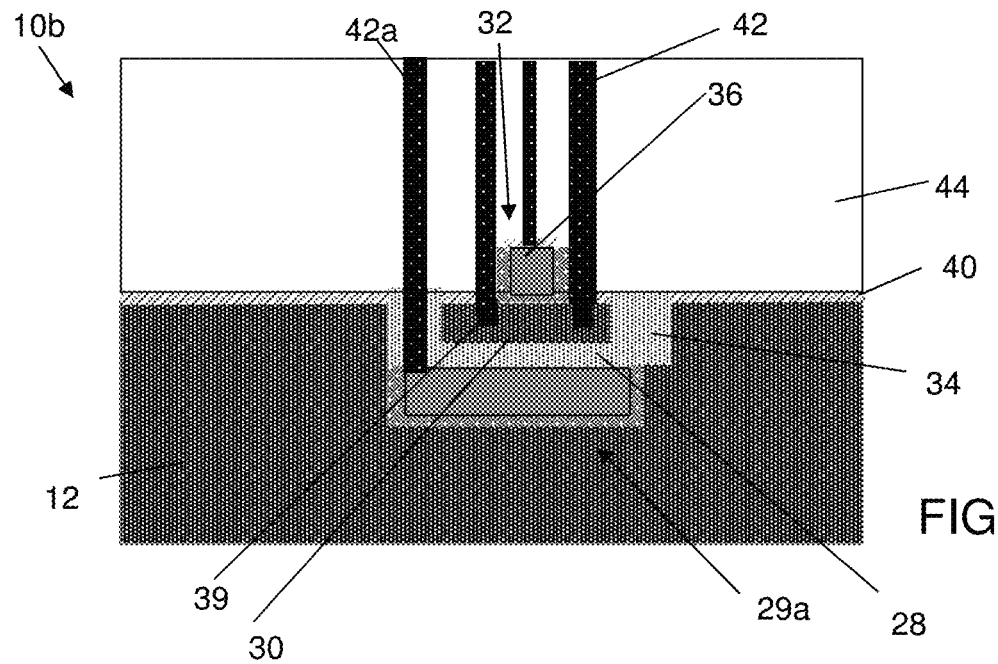
FIG. 16A shows an upper gate structure and a lower gate structure of a different dimension, amongst other features, and respective fabrication processes in accordance with additional aspects of the present disclosure.

FIG. 16A shows a structure 10b which, instead of forming a FET in a trench, under a second FET, shows forming a body bias or back gate bias electrode in a trench under a FET. The structure 10b in FIG. 16A includes the upper FET structure 32 and a lower back bias electrode structure 29a, separated by the insulator material 28. In embodiments, the lower back bias electrode 29a is formed over gate oxide 15. In this embodiment, the lower back bias electrode structure 29a extends beyond the edges of the upper gate structure 32 and the epitaxial material 30 and the contact 42a only contacts the back bias electrode 29a and does not contact source/drain of the upper FET 32. In other words, the lower back bias electrode structure 29a can be longer or wider than the upper gate structure 32. In this way, a contact 42a can be provided in contact with the lower back bias electrode structure 29a, formed in the same manner as the contacts 42, which contact the upper FET source/drain, gate, or body. In addition, in this structure 10b, the substrate material 12 can be a low cost bulk wafer instead of a high cost SOI wafer in which a doped portion of the handle wafer is used as a back bias electrode, with the back bias electrode 29a isolated from the substrate 12 by gate dielectric material or other oxide or insulator material. The lower back bias electrode structure 29a can be biased to deplete the body of the upper gate structure 32.

Figure 16B:
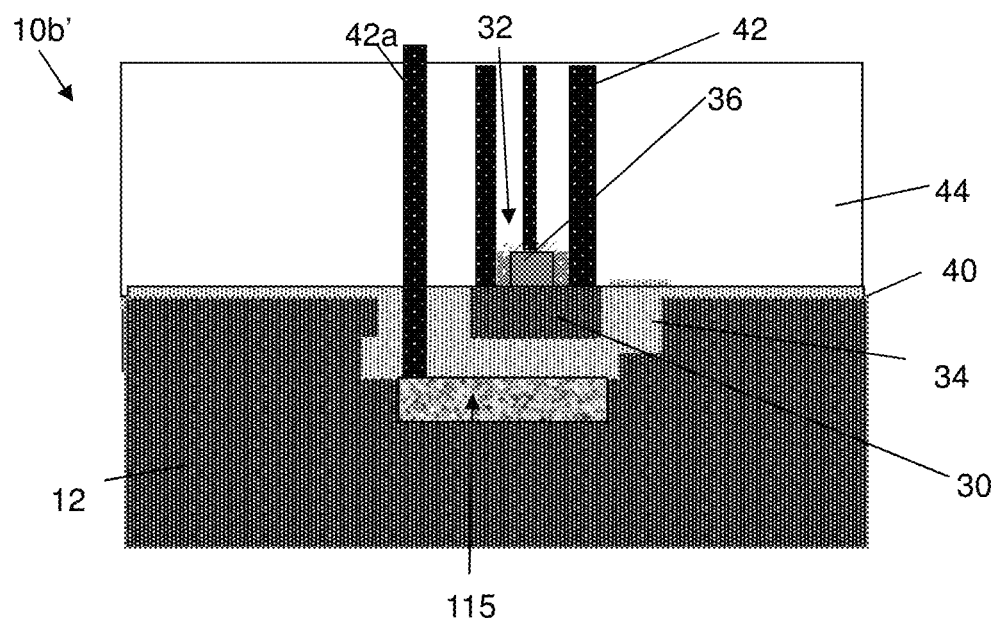
FIG. 16B shows an alternative embodiment of FIG. 16A in accordance with additional aspects of the present disclosure.

FIG. 16B shows an alternative structure 10b' of the structure 10b shown in FIG. 16A. In this alternative structure 10b', the back bias electrode is formed from n-type or p-type doped region 115 of the crystalline silicon. Referring back to the previous figures: trench 14 is patterned and etched; doped silicon region 115 is patterned and implanted; oxide layer 28 is deposited, planarized, and recessed; and epitaxial silicon layer 30 is formed, FET's 30 are formed; and the FET's and back bias electrode are contacted.

Figure 17:
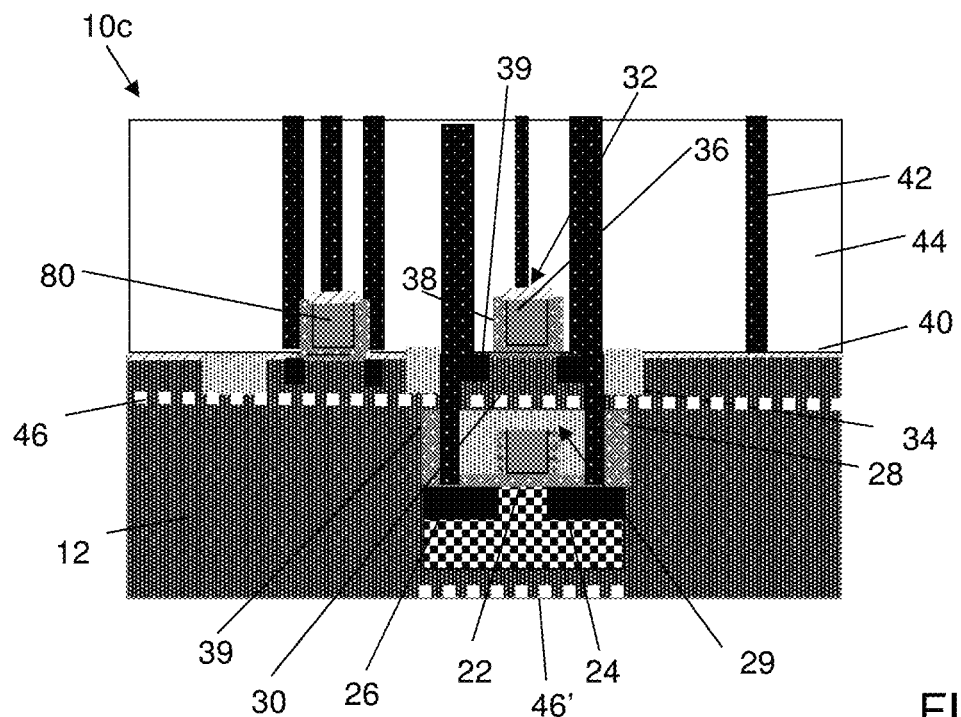
FIG. 17 shows an upper gate structure and lower gate structure with a polysilicon isolation layer underneath, amongst other features, and respective fabrication processes in accordance with aspects of the present disclosure.

FIG. 17 shows a structure 10c with polysilicon isolation layers 46 and 46' in the substrate 12 under the lower gate structure formed on the trench bottom 14, under the upper FET 32 formed on the epitaxial material 30, and under the FET 80 formed on the top surface of the wafer 12. The remaining features of the structure 10c can be similar to the structure 10b of FIG. 16A. The polysilicon layers 46 and 46' can be formed by an unmasked or photolithographically masked argon implant followed by a rapid thermal anneal as known in the art. In embodiments, the argon dose is 1E14 to 2E15. In embodiments, the rapid thermal anneal is performed at 950° C. to 1100° C. for less than 10 seconds. In embodiments, the polysilicon layer 46' under the lower gate structure 29 formed on the bottom of trench 14 can be formed by an argon implant after the trench 14 is formed, prior to formation of the lower gate structure 29 on the trench 14 bottom. The polysilicon layer 46 near the surface of substrate 12 can be formed prior to the FET 32 and 80 gate formation; and can be formed at the same time in the process or as two separate processes using two Ar implants and photolithographic masks. For the back bias electrode structure 10b, the polysilicon layer 46 could be formed under the FET's on the surface of substrate 12.

Figure 18:
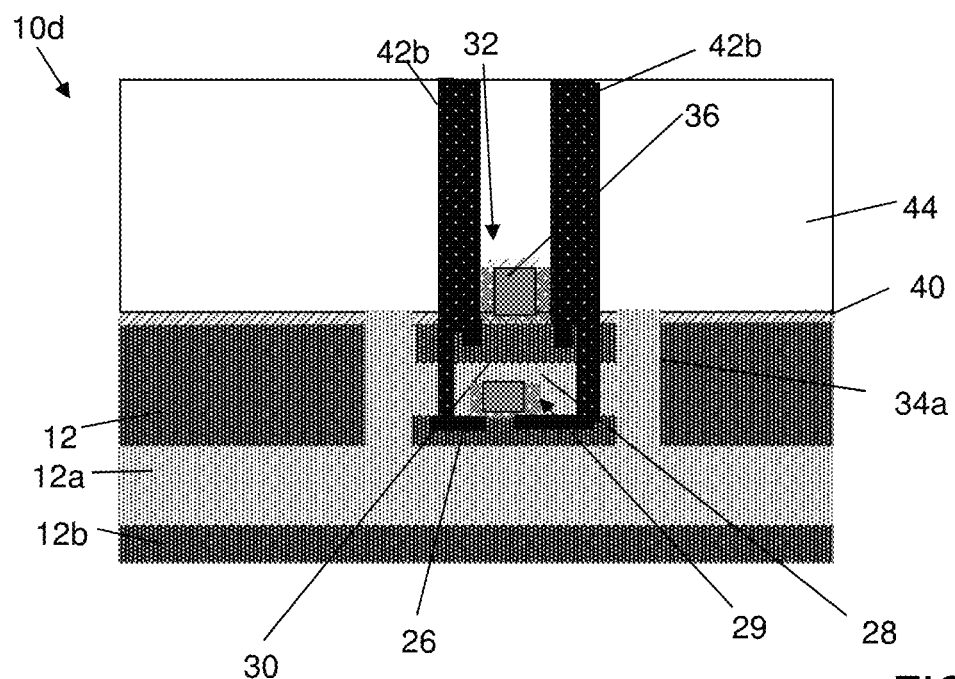
FIG. 18 shows an upper gate structure and lower gate structure in semiconductor on insulator (SOI) technologies, amongst other features, and respective fabrication processes in accordance with aspects of the present disclosure.

FIG. 18 shows the upper gate structure 32 and the lower gate structure 29 using semiconductor on insulator (SOI) technologies, amongst other features. In this structure 10d, the lower gate structure 29 is formed on SOI technologies composed of a wafer 12b, a buried oxide layer 12a and a semiconductor substrate 12. In embodiments, the semiconductor substrate 12 may be composed of any suitable material including, but not limited to, Si, SiGe, SiGeC, SiC, GaAs, InAs, InP, and other III/V or II/VI compound semiconductors. In addition, the structure 10d shows dual shallow trench isolation regions 34a isolating the lower gate structure 29 and which can be used to eliminate vertical dopant diffusion during epi growth. Also, in embodiments, in this and other aspects described herein, the source/drain regions and channel extension region 26 can be doped with As to minimize dopant diffusion.

Figure 19:
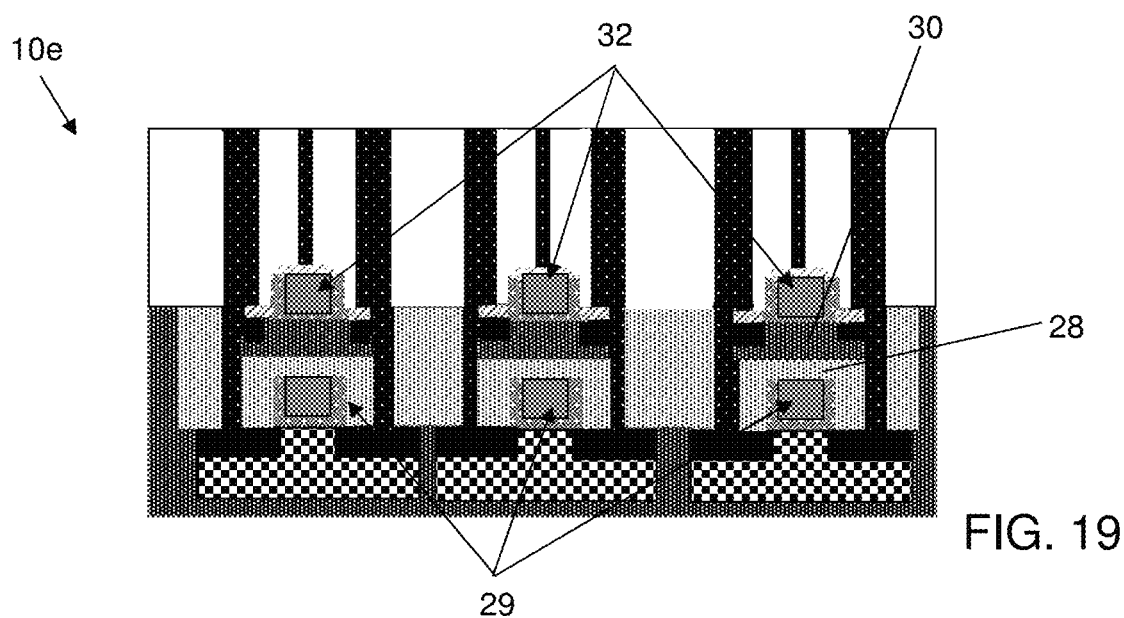
FIG. 19 shows a multi-finger device with multiple upper gate structures and multiple lower gate structures, amongst other features, and respective fabrication processes in accordance with aspects of the present disclosure.

FIG. 19 shows a multi-finger device 10e with multiple upper gate structures 32 and multiple lower gate structures 29, each of which are separated by the insulator material 28. The multi-finger device 10e is a multi-finger NFET switch or stacked NFET/PFET, with the multiple upper gate structures 32 and multiple lower gate structures 29 being NFETs and/or PFETs depending on the design characteristics of the device. This multifinger device could be formed on both the SOI and the bulk wafer embodiments.

Referring still to FIG. 19, in embodiments, the multiple lower gate structures 29 can be fabricated using the same deposition and patterning schemes, within a larger trench. Also, the multiple upper gate structures 32 can be fabricated using the same deposition and patterning schemes on the epitaxial material 30. Multiple shallow trench isolation structures 34 can fabricated to isolate the multiple upper gate structures 32, e.g., cut the epitaxial material 30 into several isolated islands. The remaining processes can be similar to that already described herein including, e.g., formation of source and drain regions for the multiple upper gate structures 32 and multiple lower gate structures 29.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   at least one lower gate structure on a bottom of a trench formed in substrate material;
   insulator material partially filling the trench and over the at least one lower gate structure;
   an epitaxial material on the insulator material and isolated from sidewalls of the trench; and
   at least one upper gate structure stacked vertically above the at least one lower gate structure and located on the epitaxial material,
   wherein the epitaxial material and the substrate material are crystalline silicon based materials.

2. The structure of claim 1, wherein the insulator material isolates the epitaxial material from source and drain regions of the at least one lower gate structure.

3. The structure of claim 1, wherein the at least one lower gate structure and the at least one upper gate structure are multiple lower and upper gate structures forming a multi-finger NFET switch or stacked NFET/PFET.

4. The structure of claim 1, further comprising a lateral undercut metal on source and drain regions of the at least one lower gate structure.

5. The structure of claim 1, wherein the at least one upper gate structure is on a partially or fully depleted body, which is biased to deplete a body of the at least one upper gate structure.

6. The structure of claim 1, further comprising a first contact which contacts both a source region of the at least one lower gate structure and the at least one upper gate structure and a second contact which contacts both a drain region for both the at least one lower gate structure and the at least one upper gate structure.

7. The structure of claim 1, wherein the substrate material is formed over a buried oxide material in semiconductor on insulator wafer.

8. A structure comprising:
   at least one lower gate structure on a bottom of a trench formed in substrate material;
   insulator material partially filling the trench and over the at least one lower gate structure;
   an epitaxial material on the insulator material and isolated from sidewalls of the trench; and
   at least one upper gate structure stacked vertically above the at least one lower gate structure and located on the epitaxial material, wherein the epitaxial material includes source and drain regions for the at least one upper gate structure, and the epitaxial material is isolated from the substrate material by shallow trench isolation regions.

9. A structure comprising:
   at least one lower gate structure on a bottom of a trench formed in substrate material;
   insulator material partially filling the trench and over the at least one lower gate structure;
   an epitaxial material on the insulator material and isolated from sidewalls of the trench; and
   at least one upper gate structure stacked vertically above the at least one lower gate structure and located on the epitaxial material,
   wherein the at least one lower gate structure extends beyond the epitaxial material and a contact structure extends to and is in contact with the at least one lower gate structure at a side of the epitaxial material.

10. A structure comprising:
    at least one lower gate structure on a bottom of a trench formed in substrate material;
    insulator material partially filling the trench and over the at least one lower gate structure;
    an epitaxial material on the insulator material and isolated from sidewalls of the trench; and
    at least one upper gate structure stacked vertically above the at least one lower gate structure and located on the epitaxial material,
    wherein the at least one lower gate structure is a back bias electrode extending beyond edges of the at least one upper gate structure and the epitaxial material and a contact only contacts the back bias electrode and does not contact source/drain regions of the at least one upper gate structure.

* * * * *